(12) United States Patent
Letertre

(10) Patent No.: US 8,343,782 B2
(45) Date of Patent: Jan. 1, 2013

(54) SEMICONDUCTOR DEVICE HAVING AN INGAN LAYER

(75) Inventor: Fabrice M. Letertre, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 12/893,535

(22) Filed: Sep. 29, 2010

(65) Prior Publication Data

US 2011/0134954 A1 Jun. 9, 2011

(30) Foreign Application Priority Data

Dec. 7, 2009 (EP) .................................... 09290913

(51) Int. Cl.
*H01L 21/00* (2006.01)

(52) U.S. Cl. .......... 438/22; 257/183; 257/189; 257/615; 257/E33.001; 257/E33.023; 257/E33.025; 438/455; 438/458; 438/478; 438/481; 438/483; 438/502; 438/509

(58) Field of Classification Search .................. 257/183, 257/189, 198, 200, 201, 613, 615, 618, E33.001, 257/E33.011, E33.002, E33.023, E33.025, 257/E33.026, E33.028, E33.03, E33.033; 438/455, 458, 478, 481, 483, 502, 509
See application file for complete search history.

(56) References Cited

U.S. PATENT DOCUMENTS

| | | | |
|---|---|---|---|
| 6,303,405 B1 * | 10/2001 | Yoshida et al. ................. | 438/46 |
| 6,320,206 B1 * | 11/2001 | Coman et al. .................... | 257/94 |
| 6,455,340 B1 | 9/2002 | Chua et al. ...................... | 438/31 |
| 6,627,552 B1 * | 9/2003 | Nishio et al. ................... | 438/694 |
| 6,746,777 B1 * | 6/2004 | Hwang ........................ | 428/457 |
| 6,956,246 B1 | 10/2005 | Epler et al. ....................... | 257/94 |
| 7,751,455 B2 | 7/2010 | Kneissl ....................... | 372/45.01 |
| 2002/0030198 A1 | 3/2002 | Coman et al. .................. | 257/103 |
| 2004/0077114 A1 * | 4/2004 | Coman et al. ................... | 438/46 |
| 2004/0195656 A1 | 10/2004 | Ghyselen et al. ............. | 257/616 |
| 2006/0076559 A1 * | 4/2006 | Faure et al. ...................... | 257/49 |
| 2006/0121702 A1 * | 6/2006 | Coman et al. .................. | 438/483 |
| 2007/0072324 A1 * | 3/2007 | Krames et al. .................. | 438/46 |
| 2008/0149954 A1 * | 6/2008 | Akita .............................. | 257/94 |
| 2008/0268618 A1 * | 10/2008 | Yamazaki ..................... | 438/458 |
| 2008/0280420 A1 * | 11/2008 | Yamazaki ..................... | 438/458 |
| 2008/0286939 A1 * | 11/2008 | Ohnuma ....................... | 438/458 |

(Continued)

FOREIGN PATENT DOCUMENTS

GB 2 346 480 A 8/2000

(Continued)

OTHER PUBLICATIONS

European Sear ch Report EP 09 29 0913.4 dated May 18, 2010.

*Primary Examiner* — Steven Loke
*Assistant Examiner* — Sitaramarao S Yechuri
(74) *Attorney, Agent, or Firm* — Winston & Strawn LLP

(57) ABSTRACT

The present invention relates to a method that involves providing a stack of a first substrate and a InGaN seed layer formed on the first substrate, growing an InGaN layer on the InGaN seed layer to obtain an InGaN-on-substrate structure, forming a first mirror layer overlaying the exposed surface of the grown InGaN layer, attaching a second substrate to the exposed surface of the mirror layer, detaching the first substrate from the InGaN seed layer and grown InGaN layer to expose a surface of the InGaN seed layer opposite the first mirror layer, and forming a second mirror layer overlaying the opposing surface of the InGaN seed layer.

18 Claims, 2 Drawing Sheets

U.S. PATENT DOCUMENTS

| | | | |
|---|---|---|---|
| 2008/0293217 A1* | 11/2008 | Ghyselen et al. | 438/458 |
| 2008/0303118 A1* | 12/2008 | Arena et al. | 257/615 |
| 2010/0098127 A1 | 4/2010 | Higuchi et al. | 372/50.11 |

FOREIGN PATENT DOCUMENTS

| | | | |
|---|---|---|---|
| JP | 06045644 | A2 | 2/1994 |
| JP | 11031810 | A2 | 2/1999 |
| JP | 2003234542 | A2 | 8/2003 |
| JP | 2004 247563 | A | 9/2004 |
| JP | 2005322857 | A2 | 11/2005 |
| JP | 2005347747 | A2 | 12/2005 |
| JP | 2006173621 | A2 | 6/2006 |
| JP | 2007096331 | A2 | 4/2007 |
| JP | 2008153561 | A2 | 7/2008 |

* cited by examiner

US 8,343,782 B2

SEMICONDUCTOR DEVICE HAVING AN INGAN LAYER

FIELD OF INVENTION

The present invention relates to the manufacture of a semiconductor device comprising an InGaN layer on a carrier substrate and, particularly, the manufacture of a vertical optoelectronic structure comprising an InGaN layer as an active layer.

BACKGROUND OF THE INVENTION

The formation of high-quality thin III-nitride layers poses a demanding problem in the context of recent high-performance semiconductor devices, for example, transistor devices and optoelectronic devices, in particular, laser devices such as vertical cavity surface-emitting lasers (VCSELs).

Conventionally, a high-quality thin III-nitride layer is formed by epitaxial growth on a seed substrate, for example, a sapphire substrate, by molecular beam epitaxy (MBE), metalorganic vapour phase epitaxy or hybrid vapour phase epitaxy. Epitaxial growth on the seed substrate commonly involves the growth of a thick III-nitride layer, commonly referred to as a buffer or buffer layer, prior to growth of the high quality thin III-nitride layer, wherein the thick III-nitride buffer layer promotes an improvement in the quality of the III-nitride material of the thin layer.

The grown layer can subsequently be transferred to a target wafer by some wafer transfer process known in the art, for example, bonding and laser lift-off or the SMART Cut™ process. Thinning of the III-nitride layer(s) to produce the high quality thin III-nitride layer can be achieved by removal of the thick buffer layer after the wafer transfer. Such a thinning process can be achieved, for example, by grinding, polishing or plasma etching the layer(s). Controlled uniform thinning of the III-nitride material can be complex due to the thickness of the buffer layer and this can impact the thickness uniformity of the thin high quality III-nitride layer.

The defect density of the transferred III-nitride layer proves crucial for the performance characteristics of the eventually finished semiconductor device. A main reason for the defects can be seen in strain induced in the III-nitride layer due to growth on a layer exhibiting a different crystal structure, i.e., a mismatch of the crystal lattice constant of the III-nitride layer and the seed layer whereupon it is epitaxially grown.

In addition, the strain state and polarity of the transferred III-nitride layer can prove crucial for performance characteristics of the eventually finished semiconductor device. Such characteristics may include, for example, the carrier recombination efficiency. Strain between the transferred III-nitride layer and a subsequent active layer can affect internal piezoelectric fields within the semiconductor device. Furthermore, the polarity of the transferred III-nitride layer can also affect the piezoelectric fields within the semiconductor structure and polarity selection may be utilized in order to mitigate the affect of strain on the internal electric fields.

Thin III-nitride layers represent the main elements of recent down-scaled optoelectronic devices, particularly, laser devices such as vertical cavity surface-emitting lasers (VCSELs). U.S. Pat. No. 6,320,206 B1 discloses a method for the manufacture of a VCSELs having wafer bonded aluminum-gallium-indium-nitride structures and mirror stacks. According to the teaching of U.S. Pat. No. 6,320,206 B1, p- and n-doped InAlGaN layers are grown on a sapphire substrate and subsequently transferred to a target substrate. In the resulting structure the InAlGaN layers are sandwiched by mirror layers to obtain a VCSEL.

Despite the recent engineering progress, however, there is still a need for providing III-nitride layers with enhanced uniformity and reduced defect density in general and, in particular, improved VCSELs based on III-nitride layers. The invention now satisfies this need and provides such improved prodcuts and structures.

SUMMARY OF THE INVENTION

The present invention relates to the manufacture of a vertical optoelectronic structure, and in particular, a vertical cavity surface-emitting laser (VCSEL) which results in a high uniformity and low dislocation density active InGaN layer grown on an InGaN seed layer. The invention provides devices of unprecedented quality in terms of homogeneity of the cavity/active layer, threshold current, and position alignment of anti-nodes with respect to the multiple quantum wells of the active layer. In particular, it provides a vertical cavity surface-emitting laser, comprising two mirror layers, preferably formed from distributed Bragg reflectors, sandwiching the InGaN layer(s).

The invention also relates to a method that comprises providing a stack comprising a first substrate and an InGaN seed layer formed on the first substrate, growing an InGaN layer on the InGaN seed layer to obtain an InGaN-on-substrate structure, forming a first mirror layer overlaying a surface of the InGaN layer opposite the first substrate, detaching the first substrate, and forming a second mirror layer overlaying an opposing surface of the InGaN seed layer. The InGaN layer may be grown to a thickness within the range of 100 nm to 2000 nm. The InGaN seed layer may be grown to a thickness within the range of 5 nm to 500 nm.

The method may also further comprise providing a second substrate with the first mirror layer formed thereon, bonding the InGaN-on-substrate structure to the first mirror layer formed on the second substrate, and removing the stack of the first substrate and the InGaN seed layer to expose the opposing surface of the grown InGaN layer. The method may instead further comprise forming the first mirror layer on the InGaN layer, bonding a second substrate to the first mirror layer overlaying the surface of the InGaN layer, and removing the stack of the first substrate and the InGaN seed layer to expose the opposing surface of the grown InGaN layer. The InGaN seed layer can be removed by etching or polishing. The method may further comprise forming the first mirror layer on the InGaN layer, bonding a second substrate to the first mirror layer, exposing a surface of the InGaN seed layer, and forming the second mirror layer on the exposed surface of the InGaN seed layer. The first mirror layer and the second mirror layer can comprise all-oxide distributed Bragg reflectors or III-nitride distributed Bragg reflectors, wherein the mirror layers have a high reflectivity of about 99%. The provided stack can also further comprises a dielectric layer between the first substrate and the InGaN seed layer.

The stack can be formed by growing the InGaN seed layer on a third substrate, wherein the third substrate can be a free-standing GaN substrate, bonding the grown InGaN seed layer to a fourth substrate by a bonding layer, wherein the bonding layer can be a glassy reflowable layer such as a borophosphosilicate glass, relaxing the InGaN seed layer by heat treatment before or after removal of the third substrate, and transferring the relaxed InGaN seed layer to the first substrate by means of the dielectric layer. The InGaN seed layer on the first substrate has a thickness defined by an ion implantation produced weakened region. The method may also involve forming the stack by the following steps of growing the InGaN seed layer on a third substrate, wherein the third substrate is a GaN substrate, bonding the grown InGaN seed layer to a fourth substrate by a bonding layer, relaxing the InGaN seed layer by heat treatment before or after removal of the third substrate, and transferring the relaxed InGaN seed layer to the first substrate. The bonding layer can be a borophosphosilicate glass (BSG) layer or a $SiO_2$—compound layer comprising boron or phosphorous, wherein the $SiO_2$—compound comprises B (BSG) or P (PSG). The GaN substrate preferably has a dislocation density of less than $5 \times 10^8$ cm$^{-2}$. The method may further comprise forming a dielectric bonding layer between the substrate and InGaN seed layer, wherein the dielectric bonding layer includes an electromagnetic absorbing layer disposed therein to promote subsequent detachment of the substrate by absorption of electromagnetic radiation, wherein the detachment is by a laser lift-off processes.

The invention also relates to a vertical optoelectronic structure comprising an InGaN seed layer, an active InGaN layer grown on the InGaN seed layer, two mirror layers on opposing sides of and sandwiching the InGaN seed layer and active InGaN layer. Another embodiment relates to a vertical cavity surface-emitting laser device comprising a substrate, a first mirror layer attached and adjacent to the substrate, an InGaN seed layer on the first mirror layer an active InGaN layer grown on the InGaN seed layer, and a second mirror layer attached and adjacent to the active InGaN layer, wherein the first mirror layer and second mirror layer are distributed Bragg reflectors. The device can further comprise a dielectric layer between the first substrate and the InGaN seed layer, wherein the dielectric layer is a $SiO_x$ or a $Si_xN_y$ layer.

DETAILED DESCRIPTION OF THE INVENTION

Figure 1:
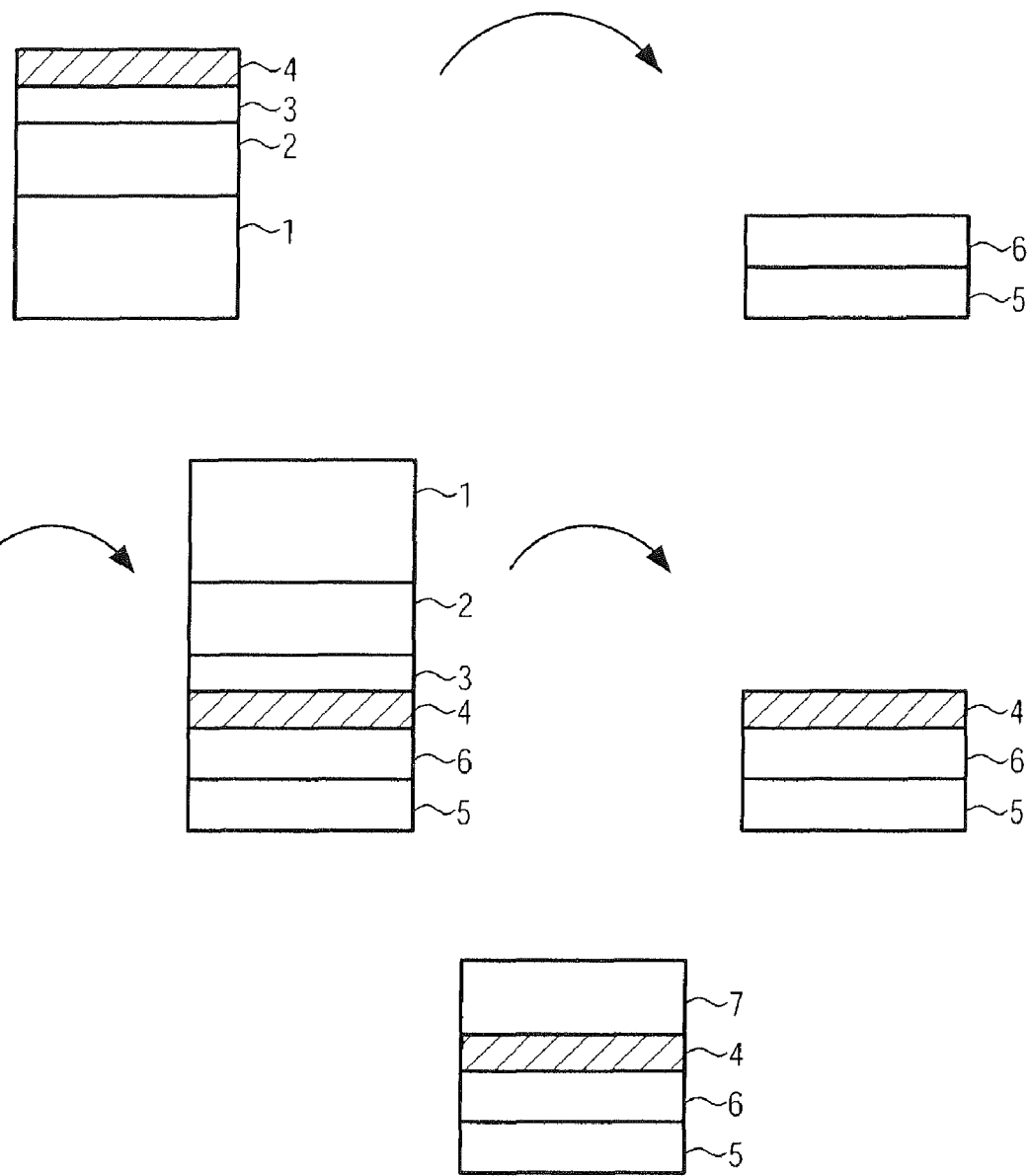
FIG. 1 illustrates an example of the inventive method for the manufacture of a VCSEL comprising an InGaN active layer.

The present invention addresses the above-mentioned need and, accordingly, provides a method for the manufacture of thin high-quality III-nitride layers.

In a preferred embodiment of the invention, the method comprises the steps of providing a layered stack comprising a first substrate and an InGaN seed layer, where the InGaN seed layer is preferably a relaxed InGaN seed layer that is formed on the first substrate; and growing an InGaN layer on the InGaN seed layer to obtain an InGaN-on-substrate structure.

By growing the InGaN layer on a thin InGaN seed layer, in particular, a relaxed InGaN seed layer and, wherein the InGaN seed layer can be a relaxed polar, relaxed semi-polar or a relaxed non-polar InGaN seed layer, an InGaN-on-substrate structure can be obtained that can be used for further manufacturing a semiconductor device without the need for removal of a thick buffer layer on which the InGaN layer is grown during subsequent processing steps. Thereby, high uniformity of the grown InGaN layer can be maintained.

The method may further comprise the steps of forming a first mirror layer overlaying a surface of the InGaN layer, wherein the surface on which the first mirror layer is formed is the exposed InGaN surface opposite the first substrate; detaching the first substrate; and forming a second mirror layer overlaying an opposing surface of the InGaN layer(s) (i.e. the surface opposing the one on which the first mirror layer is overlaid).

The inventive method may also further comprise providing a second substrate with the first mirror layer formed thereon, wherein the mirror layer is preferably formed from distributed Bragg reflectors (DBRs); bonding the InGaN-on-substrate structure to the first mirror layer formed on the second substrate; detaching the first substrate from the InGaN layer (s) and removing the InGaN seed layer to expose a surface of the thin high-quality InGaN layer; and forming the second mirror layer on the exposed surface of the InGaN layer opposite the first mirror layer, wherein the second mirror layer is also preferably formed from distributed Bragg reflectors.

In another example, the structure comprising the mirror layers may be obtained by the steps of forming the first mirror layer, preferably formed from distributed Bragg reflectors, on the exposed surface of the InGaN layer; bonding a second substrate to the first mirror layer; detaching the first substrate from the InGaN layer(s) and removing the InGaN seed layer to expose an opposing surface of the InGaN layer; and forming the second mirror layer, also preferably formed from distributed Bragg reflectors, on the exposed surface of the InGaN layer.

In each of the examples, the removal of the InGaN seed layer may be achieved by etching or polishing. In other embodiments of the invention, the removal of the InGaN seed layer may be achieved by thermal oxidation/deoxidation processes, or by photo-electrochemical (PEC) etching processes. Furthermore, since the InGaN seed layer can be provided as a relatively thin layer, perfect removal of this layer in order to expose a surface of the underlying InGaN can be readily performed. However, since the InGaN seed layer is provided as a high-quality thin layer it may be preferred to omit the step of removing this layer thereby simplifying the overall procedure.

Therefore, according to another embodiment, the inventive method comprises the steps of forming a first mirror layer, in particular, formed from distributed Bragg reflectors, on the InGaN layer; bonding a second substrate to the first mirror layer; detaching the first substrate and exposing a surface of the InGaN seed layer; and forming a second mirror layer, in particular, formed from distributed Bragg reflectors, on the exposed surface of the InGaN seed layer. In this embodiment, both the InGaN seed layer and grown InGaN layer are sandwiched between the first and second mirror layers.

The first mirror layer and second mirror layer may each comprise all-oxide distributed Bragg reflectors or alternatively III-nitride based Bragg reflectors. Paired layers of silicon dioxide with titanium dioxide, zirconium dioxide, tantalum oxide or hafnium dioxide may be chosen, in principle for all-oxide distributed Bragg reflectors. Paired layers of $Al_xGa_{1-x}N$ with GaN may be chosen, in principle, for III-nitride based Bragg reflectors. In further examples the mirror layers may instead comprise metallic materials. Moreover, where appropriate an intermediate bonding layer may be provided between a respective mirror layer and the active InGaN layer.

According to the embodiment of an alternative process, a vertical optoelectronic structure comprising mirror layers can be manufactured. The InGaN layer plays the role of an active layer in such a vertical optoelectronic structure that, for example, may be a vertical cavity surface-emitting laser (VCSEL).

Furthermore, alternative embodiments of the inventive method may involve forming a seed layer, in particular, a relaxed InGaN seed layer, on a first substrate, or on an intermediate substrate. The intermediate substrate may be an intermediate GaN substrate or GaN buffer layer. After forming the seed layer, with or without first providing the intermediate or buffer layer, the seed layer can then transferred to the first substrate.

Since the high-quality active layer is grown on a thin relaxed seed layer, no intensive processing for thinning of the cavity region formed between the mirrors is necessary, thereby improving the quality of the cavity region as compared to methods using a thick intermediate substrate that are known in the art. In addition, a relaxed InGaN seed layer should reduce the strain between the seed layer and the active InGaN layer grown thereupon. Such a reduction in strain in turn leads to improved internal electric fields and operational characteristics of a VCSEL structure, for example, improving carrier recombination efficiency. Such an improvement in VCSEL operational characteristics may further be accomplished utilizing relaxed semi-polar or non-polar InGaN seed layers. It is, furthermore, noted that in the above-described embodiments the first substrate may be a sapphire substrate and the second substrate may be a silicon-comprising substrate, for example, a silicon substrate.

The provided stack mentioned above may comprise a dielectric layer between the first substrate and the InGaN seed layer, such that the InGaN seed layer is not provided directly on a surface of the first substrate but on a surface of the dielectric layer that was previously formed on a surface of the first substrate. Appropriate examples for the dielectric layer are $SiO_x$ or $Si_xN_y$ layers. This dielectric layer may be provided for facilitating transfer of the relaxed InGaN seed layer to the first substrate. The dielectric layer may also be used for facilitating wafer transfer of the InGaN layer(s) to the second substrate. In certain embodiments of the invention the dielectric layer may include an electromagnetic absorption layer for facilitating a laser lift-off processes.

In another embodiment, the stack of InGaN layers may be formed by growing the InGaN seed layer on a third substrate, bonding the grown InGaN seed layer to a fourth substrate with a bonding layer, wherein the bonding layer comprises or consists of a borophosphosilicate glass layer, or an $SiO_2$— compound layer comprising boron or phosphorous, relaxing the InGaN seed layer by heat treatment before or after removal of the third substrate, and transferring the relaxed InGaN seed layer to the first substrate for subsequent growth of the high quality active InGaN layer. Alternatively, the relaxed InGaN seed layer may be transferred to the first substrate by means of the dielectric layer.

The InGaN seed layer is obtained from growth on a template or other reusable substrate, e.g., a GaN layer on sapphire or freestanding GaN substrate, made of a material of high quality with respect to the defect density. Thus, the thickness of the relaxed InGaN seed layer can be rather low (e.g., in the range of 5 nm to 500 nm) without affecting the material quality.

According to these embodiments, the third substrate whereon the InGaN seed layer is grown can be a template or other reusable substrate, e.g., a GaN layer on sapphire or freestanding GaN substrate. Advantageously, the template or reusable substrate has a dislocation density of less than $5 \times 10^8$ $cm^{-2}$, or less than $10^7$ $cm^{-2}$. This low dislocation density is inherited by the grown InGaN seed layer thus allowing the present invention to obtain a high-quality (active) InGaN layer subsequently grown on the InGaN seed layer. The InGaN layer can be grown to a thickness within the range of 100 nm to 2000 nm, or more preferably, 500 to 1500 nm. According to the inventive method, the InGaN seed layer is grown to relatively low thickness on the GaN substrate that has a dislocation density of less than $10^7$ $cm^{-2}$. The thickness of the InGaN seed layer may lie in the range of 5 nm to 500 nm. The composition of the InGaN seed layer may lie in the range of 1 to 30% indium. One example for the range of compositions for the seed layer may be: $In_{0.01}Ga_{0.99}N$ to $In_{0.3}Ga_{0.7}N$. Due to the thin InGaN seed layer used for growing the (active) InGaN layer, the cavity thickness of a VCSEL device formed according to the present invention can be reduced as compared to the known art, thereby improving (i.e. reducing) the threshold current needed for the operation of the device.

As already mentioned, all of the above embodiments of the inventive method can be used for the manufacture of a vertical optoelectronic structure, and in particular, a vertical cavity surface-emitting laser (VCSEL), thereby obtaining devices of unprecedented quality in terms of homogeneity of the cavity/active layer, threshold current, position alignment of antinodes with respect to the multiple quantum wells of the active layer, etc. In particular, the disclosed methods provide a vertical cavity surface-emitting laser, comprising two mirror layers, preferably formed from distributed Bragg reflectors, sandwiching an active InGaN layer alone or an active InGaN layer and an InGaN seed layer, which is obtainable by a method according to one of the above-described embodiments. Furthermore, the methods provide a vertical cavity surface-emitting laser, comprising a stack comprising the following layers in this order: a substrate; a first mirror layer, preferably formed from distributed Bragg reflectors; an active InGaN layer; an InGaN seed layer; and a second mirror layer, also preferably formed from distributed Bragg reflectors.

Additional features and advantages of the present invention will be described with reference to the drawings. In the description, reference is made to the accompanying figures that are meant to illustrate preferred embodiments of the invention. It is understood that such embodiments do not represent the full scope of the invention.

FIG. 1 illustrates an example of a preferred embodiment of the inventive method for the manufacture of a target wafer including an InGaN layer. FIG. 1 shows the growth of an InGaN layer upon an InGaNoS (InGaN on Substrate) engineered substrate. According to this example, the InGaNoS structure comprises a sapphire substrate 1, a dielectric bonding layer 2, which is optional, and a relaxed InGaN seed layer 3 which can be a polar relaxed, semi-polar relaxed or non-polar relaxed InGaN layer. An InGaN layer 4 can subsequently be epitaxially grown on the relaxed InGaN seed layer 3 provided on the bonding layer 2 and sapphire substrate 1.

The relaxed InGaN seed layer 3 on the sapphire substrate 1 or dielectric bonding layer 2 may be obtained by a process where a GaN template (free-standing substrate or third substrate) is provided that may exhibit polar, semi-polar or no polarity that will be inherited by the InGaN layer grown thereon, growing the InGaN seed layer on this third substrate, bonding the grown InGaN seed layer to a fourth substrate with a bonding layer, and subjecting to heat treatment in order to relax the InGaN seed layer 3. The GaN template advantageously has a low dislocation density (e.g., below $10^7$ $cm^{-2}$) that is also inherited by the InGaN seed layer 3 grown thereon. After the InGaN layer has been grown on the GaN template, the InGaN layer may be subject to ion implantation to form a weakened region therein to facilitate transfer to another substrate. The ion implantation process can be utilized to define the thickness and thickness uniformity of the InGaN seed layer to be transfered. For example, the implantation dose can be selected to form the weakened region at a desired depth within the InGaN layer, thereby defining the thickness of the seed layer. Preferably, the implantation can be made into the substrate underlying the InGaN layer, i.e., into the GaN template or freestanding GaN material. In addition, implantation dose and splitting parameters can be selected to produce a desired thickness uniformity in the InGaN seed layer or seed-layer/substrate combination.

Before or after removal of the template or reusable substrate, the structure is subject to heat treatment in order to relax the InGaN seed layer 3 or seed layer/substrate layer combination. After relaxation, the relaxed InGaN seed layer 3 is transferred to the sapphire substrate 1 or dielectric bonding layer 2 in order to function as the relaxed InGaN seed layer 3 for the further processing. It might be preferrable to form a dielectric bonding layer 2, for example, an SiOx or SixNy layer directly on the surface of the sapphire substrate 1 to facilitate transfer of the relaxed InGaN seed layer 3 to the sapphire substrate 1. In each embodiment, the InGaN seed layer 3 is obtained from growth on a template or other reusable substrate, e.g., a GaN layer on sapphire or freestanding GaN substrate, made of a material of high quality with respect to the defect density (e.g., the above-mentioned GaN template) and, thus, the thickness of the relaxed InGaN seed layer 3 can be rather low (e.g., in the range of 5 nm to 500 nm) without affecting the material quality. An InGaN layer 4 can subsequently epitaxially grown on the relaxed InGaN seed layer 3 provided on the sapphire substrate 1. The thickness of the InGaN layer lies within the range of 200 nm to 2000 nm, particularly, 500 to 1500 nm.

The InGaN seed layer 3 may be bonded to a dielectric bonding layer 2, or may be bonded to a glassy reflowable bonding layer, for example, a borophosphosilicate glass (BPSG) or an $SiO_2$—compound comprising B (BSG) or P (PSG). Borophosphosilicate glass exhibits reflow characteristics at temperatures exceeding about 800° C. or 850° C. (depending on the actual composition of the glass) thereby allowing for relaxation of strain induced in the InGaN seed layer 3. Alternatively, one reflowable bonding layer is formed upon the InGaN seed layer 3 and another one is formed on the surface of a fourth substrate and the two bonding layers are bonded to each other. In certain embodiments, the InGaN seed layer 3 may comprise a blanket layer over the glassy reflowable bonding layer, alternatively InGaN seed layer 3 may be patterned and etched, as known in the art, into one or more InGaN seed layers with geometries including, but not limited to, circular, rectangular, etc.

As further shown in FIG. 1 the resulting structure is bonded to a mirror layer 6 formed on a carrier substrate 5. The mirror layer 5 may be fabricated from distributed Bragg reflectors (DBRs) of high reflexivity (about 99%) as known in the art. After the bonding process the sapphire substrate 1 is removed by chemical etching, grinding, or polishing. In certain other embodiments of the invention, sapphire substrate 1 is removed by a laser lift-off processes. In laser lift-off embodiments, dielectric bonding layer 2 may include an electromagnetic absorption layer to facilitate absorption of electromagnetic radiation, e.g., by laser irradiation of the dielectric bonding layer 2 through the sapphire substrate 1. Such irradiation of the dielectric bonding layer 2 including an electromagnetic absorption layer facilitates the removal of sapphire substrate 1. The remaining material of the dielectric bonding layer 2 can be removed from the InGaN seed layer 3 by etching, grinding and/or polishing.

Subsequently, the InGaN seed layer 3 is removed to expose the InGaN layer 4, as illustrated in FIG. 1. Since the relaxed InGaN seed layer 3 is relatively thin, it can be accurately and uniformly removed by etching or polishing. In other embodiments of the invention, the removal of the relaxed InGaN seed layer 3 may be achieved by thermal oxidation/deoxidation processes, or by photo-electrochemical (PEC) etching processes. In a next step, a second mirror layer 7 that also may be fabricated from distributed Bragg reflectors (DBRs) of high reflexivity (about 99%) is formed upon the exposed surface of the InGaN layer 4 that becomes the active layer of the resulting VCSEL structure. Further processing steps as known in the art, including contacting, follows to complete the formation of the VCSEL device.

Contrary to the known art using a thick buffer layer or intermediate substrate, but according to the present invention, the relaxed InGaN seed layer 3 can be removed almost perfectly without significant residuals. No etch back of a relatively thick buffer layer is necessary. Thereby, it is made possible to perfectly align the anti-node of the optical mode with the multiple quantum wells of the active InGaN region defined by the InGaN layer 4 alone (without residuals). This alignment results in a better coupling of the laser field of the VCSEL with the cavity as compared to the art.

Figure 2:
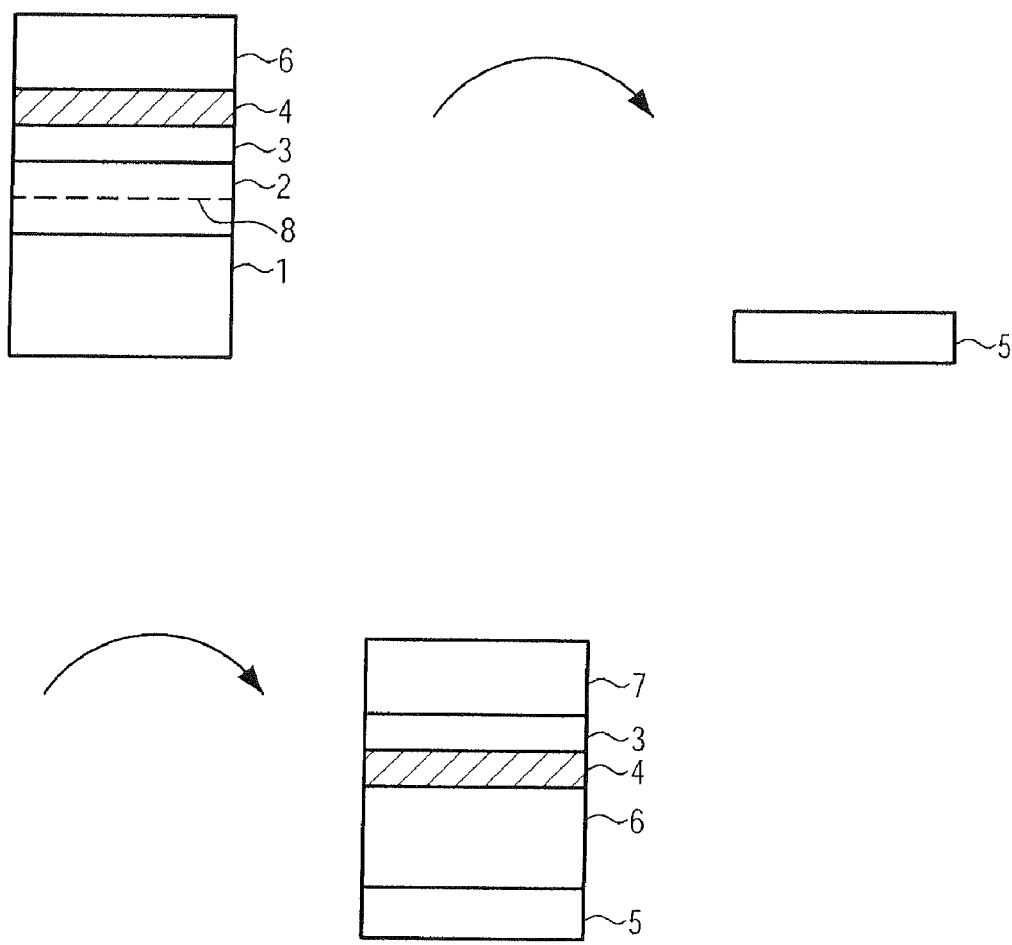
FIG. 2 illustrates another example of the inventive method for the manufacture of a VCSEL comprising an InGaN active layer.

FIG. 2 illustrates an alternative example of the inventive method compared to the one shown in FIG. 1. According to this example, an InGaNoS structure is formed as described with reference to FIG. 1. Dielectric bonding layer 2 may include an electromagnetic absorbing layer 8 disposed therein to promote subsequent detachment of the substrate 1. Additionally, a mirror layer 6 (e.g. DBR) is formed on the InGaN layer 4 that will later play the role of an active layer. The resulting structure is bonded to the carrier substrate 5. Detachment of the sapphire substrate 1 is mediated by irradiation of the electromagnetic absorption layer 8 to facilitate laser lift-off removal of sapphire substrate 1, and a portion of the dielectric layer 2, whereas the remaining material of the dielectric layer 2 is removed from the InGaN seed layer 3. The InGaN seed layer 3, according to this example, is maintained on top of the InGaN layer 4, rather than being removed. The exposed surface of the InGaN seed layer 3 is then used as a seed layer for forming the second mirror layer 7 (e.g. DBR). This is made possible by the low thickness and uniformity of the relaxed InGaN seed layer 3, and usage of the InGaN seed layer 3 may improve adherence of the mirror layer 7 grown thereon.

In both illustrative examples described above and shown in FIGS. 1 and 2, the mirror layers 6 and 7 can, for example, consist of stacked pairs of low loss dielectrics. In further examples the mirror layers 6 and 7 may comprise metallic materials. Moreover, where appropriate an intermediate bonding layer may be provided between a respective mirror layer and the active InGaN layer 4.

All previously discussed embodiments and examples are not intended as limitations but serve to illustrate features and advantages of the present invention. It is to be understood that some or all of the above described features can also be combined in different ways, and other variations and modifications will be apparent to those of ordinary skill in the art. It is intended that all of these embodiments, examples, variations and modifications thereon are meant to be encompassed within the spirit and scope of the present invention as set forth in the following claims.

What is claimed is:

1. A method for the manufacture of a vertical optoelectronic structure comprising:
    providing a stack comprising a first substrate and a relaxed InGaN seed layer;
    growing an InGaN layer on the relaxed InGaN seed layer to obtain an InGaN-on-substrate structure;

forming a first mirror layer overlaying a surface of the InGaN layer opposite the first substrate;
detaching the first substrate from the InGaN layer and the first mirror layer; and
forming a second mirror layer overlaying the InGaN layer;
wherein the stack is formed by:
  growing the InGaN seed layer on a second substrate;
  bonding the grown InGaN seed layer to a third substrate by a bonding layer comprising a borophosphosilicate glass;
  relaxing the InGaN seed layer by heat treatment before or after removal of the second substrate; and
  transferring the relaxed InGaN seed layer to the first substrate by means of a dielectric layer.

2. The method according to claim 1, wherein the InGaN layer is grown to a thickness within the range of 100 nm to 2000 nm.

3. The method according to claim 1, wherein the InGaN seed layer is grown to a thickness within the range of 5 nm to 500 nm.

4. The method according to claim 1, wherein forming the first mirror layer overlaying a surface of the InGaN layer opposite the first substrate further comprises
  forming the first mirror layer on a fourth substrate; and
  bonding the InGaN-on-substrate structure to the first mirror layer formed on the fourth Substrate.

5. The method according to claim 4, wherein the first substrate and the InGaN seed layer are detached from the InGaN layer and first mirror layer to expose the InGaN layer, and
  wherein the second mirror layer is formed directly overlaying the exposed InGaN layer.

6. The method according to claim 1, which further comprises:
  bonding a fourth substrate to the first mirror layer overlaying the surface of the InGaN layer.

7. The method according to claim 6, wherein the InGaN seed layer is removed by etching or polishing.

8. The method according to claim 6, wherein the first substrate is detached from the InGaN layer and first mirror layer to expose the InGaN seed layer, and
  wherein the second mirror layer is formed directly overlaying the exposed InGaN seed layer.

9. The method according to claim 1, which further comprises:
  bonding a fourth substrate to the first mirror layer;
  exposing a surface of the InGaN seed layer; and
  forming the second mirror layer on the exposed surface of the InGaN seed layer.

10. The method according to claim 9, wherein the first mirror layer and the second mirror layer comprise all-oxide distributed Bragg reflectors or III-nitride distributed Bragg reflectors.

11. The method according to claim 1, wherein the InGaN seed layer on the first substrate has a thickness defined by an ion implantation produced weakened region.

12. The method according to claim 1, wherein the second substrate is a template or reusable substrate that includes a GaN layer.

13. The method according to claim 12, wherein the GaN layer of the template or substrate has a dislocation density of less than $5 \times 10^8$ cm$^{-2}$.

14. The method according to claim 1, wherein the stack further comprises a dielectric layer between the first substrate and the InGaN seed layer, and wherein the dielectric layer includes an electromagnetic absorbing layer disposed therein to promote subsequent detachment of the first substrate by absorption of electromagnetic radiation.

15. The method of claim 1 which results in a structure comprising:
  the InGaN seed layer;
    the InGaN layer on the InGaN seed layer; and
    the two mirror layers on opposing sides of and sandwiching the InGaN seed layer and InGaN layer;
    wherein the method further comprises using this structure as or in a vertical optoelectronic device.

16. The method of claim 15 wherein the first and second mirror layers are distributed Bragg reflectors.

17. The method of claim 15 which further comprises providing a second substrate adjacent one of the mirror layers.

18. The method according to claim 1 wherein the InGaN-on-substrate structure is subject to heat treatment in order to relax the InGaN seed layer.

* * * * *

UNITED STATES PATENT AND TRADEMARK OFFICE
CERTIFICATE OF CORRECTION

PATENT NO.          : 8,343,782 B2
APPLICATION NO.     : 12/893535
DATED               : January 1, 2013
INVENTOR(S)         : Letertre It is certified that error appears in the above-identified patent and that said Letters Patent is hereby corrected as shown below:

Column 9:
Line 26 (claim 4, line 6), change "Substrate." to -- substrate. --.

Column 10:
Line 22 (claim 14, line 3), change "laver," to -- layer, --.

Signed and Sealed this
Nineteenth Day of February, 2013

Teresa Stanek Rea
*Acting Director of the United States Patent and Trademark Office*